United States Patent [19]

Roche et al.

[11] Patent Number: 4,849,649
[45] Date of Patent: Jul. 18, 1989

[54] ELECTRIC PULSE GENERATOR OF THE TYPE WITH A SATURATABLE INDUCTANCE COIL

[75] Inventors: Michel Roche, Dijon; Gérard Raboisson, Chevigny, both of France

[73] Assignee: Commissariat a l'Energie Atomique, Paris, France

[21] Appl. No.: 186,807

[22] Filed: Apr. 27, 1988

[30] Foreign Application Priority Data

Apr. 28, 1987 [FR] France ............... 87 06015

[51] Int. Cl.$^4$ ............... G11C 13/02; H02J 3/10
[52] U.S. Cl. ............... 307/108; 307/106; 333/244; 336/172; 336/175; 328/65
[58] Field of Search ............... 307/106–110, 307/410–419; 336/20, 58, 60, 110, 134, 84 C, 146, 148, 149, 145, 160, 170–178, 184, 186, 192, 213, 218, 219, 222, 223, 225, 229, 233; 328/65, 67; 372/86, 87; 333/17 R, 17 L, 17 M, 239, 242, 244, 258, 262, 263

[56] References Cited

U.S. PATENT DOCUMENTS

| | | |
|---|---|---|
| 2,851,616 | 9/1958 | Thompson ............... 307/106 |
| 2,869,004 | 1/1959 | Melville ............... 307/108 |
| 3,015,739 | 1/1962 | Manteuffel ............... 328/65 X |
| 3,356,869 | 12/1967 | Hilton et al. ............... 307/106 |
| 3,433,977 | 3/1969 | Gagnon et al. ............... 307/106 |
| 4,017,344 | 4/1977 | Lorber et al. ............... 333/244 |
| 4,222,016 | 9/1980 | Stock et al. ............... 336/175 X |
| 4,275,317 | 6/1981 | Laudenslager et al. ............... 333/20 X |
| 4,398,156 | 8/1983 | Aaland ............... 336/172 X |
| 4,549,091 | 10/1985 | Fahlen et al. ............... 307/106 |
| 4,707,619 | 11/1987 | Chu et al. ............... 307/106 |
| 4,757,295 | 7/1988 | Pike ............... 336/175 X |

OTHER PUBLICATIONS

Instruments and Experimental Techniques, vol. 25, No. 4, Jul.–Aug. 1982, Plenum, pp. 908–912, (Shvets).
Instruments and Experimental Techniques, vol. 20, No. 1, Jan.–Feb., 1977, Plenum, pp. 130–132, (Makritskii).
Abstract of Japanese Patent No. 60-96180, abstract published Oct. 4, 1985, vol. 9, No. 248, (E-347) (1971), (Nippon Condenser).

Primary Examiner—William M. Shoop, Jr.
Assistant Examiner—Paul Ip
Attorney, Agent, or Firm—Michael N. Meller

[57] ABSTRACT

Electric pulse generator having at least one capacitor in the form of a coaxial line section and a saturatable inductance coil serving as a switch. According to the invention, the saturatable inductance coil is located within the internal conductor of the coaxial line.

6 Claims, 4 Drawing Sheets

ELECTRIC PULSE GENERATOR OF THE TYPE WITH A SATURATABLE INDUCTANCE COIL

DESCRIPTION

The present invention relates to an electric pulse generator of the type with a saturatable inductance coil.

One way of increasing the power of an electric pulse consists of considerably reducing its duration without excessively affecting its amplitude. Such a compression can be obtained according to a principle developed by the Lawrence National Livermore Laboratory, USA and more particularly described in IEEE Transactions on Nuclear Service, vol. NS-32, No. 5, October 1985.

A pulse generator of this type comprises a series of capacitors interconnected by saturatable inductance coils. The diagram of such a generator is given in FIG. 1, where capacitors 10, 20, 30 alternate with saturatable inductances 12, 22, 32. A voltage pulse VE is applied to the input at point A and charges capacitor 10. This pulse is e.g. constituted by a sinusoid arch. The inductance coil 12 is initially of high value and opposes the discharge of the capacitor. However, when the capacitor 10 is charged, the discharge current increases and the inductance coil value drops. The electrical energy then propagates towards the right, where the same mechanism occurs in the capacitor 20 -inductance coil 22 cell and so on.

FIG. 2 shows the progressive steepening of the leading edge of the voltage pulse on passing from point A to points B and C of the line.

In practice, generators of this type are known which are constructed in the manner indicated in FIG. 3. A coaxial line section L1 constitutes the capacitor and it is followed by a switch C1 with a saturatable inductance coil. A second line section L2 is followed by a second switch C2.

A particular embodiment using three ferrite rings constituting the saturatable inductance coils and four capacitors, each having a ferroelectric ceramic cylinder portion is also described in the article by Yu V. Makritskii entitled "Generator of Current Pulses with Sharp Leading Edge" published in the journal "Instruments and Experimental Technics", vol. 20, No. 1/1, 2.1.1977, pp 130–132.

Although satisfactory in certain respects, such devices suffer from the disadvantages associated with the multiplication of the line-switch interfaces. Therefore these devices are complex and costly and also lead to voltage behavior problems.

The object of the present invention is to obviate this disadvantage. Therefore the invention incorporates a much more compact structure, which also has an advantageous effect with regard to the voltage behavior. Moreover, the structure according to the invention makes it possible to use water lines, which are much simpler than the oil lines used in the prior art. With regard to the electrical performances obtained, the pulses produced have steeper edges than in the prior art and a flatter tip. Moreover, the electrical efficiency is improved.

It is pointed out that other means are known for modifying the shape of an electric pulse and more specifically for modifying the leading edge of a voltage jump. The steepening of an edge can be obtained by a coaxial propagation line along which are distributed ferrite rings having a non-rectangular hysteresis cycle. Thus, there can be 6000 ferrite rings. A voltage jump with a progressive edge applied to the line input gives rise to a wave propagating along the line with progressive steepening of the edge. The line then supplies a steep edge voltage jump.

Such a device is e.g. described in the article by V.A. Shvets entitled "Nonlinear Multichannel Pulse-Sharpening Line Containing Ferrite Rings with Nonrectangular Hysteresis Loop" published in the journal "Instruments and Experimental Technics", vol. 25, 1982, July-August, No. 4, part 1, pp 908–912.

In fact these devices are not pulse generators and are instead edge steepening means. Moreover, they do not permit the charging of one capacitor and then discharging into another capacitor across a saturatable inductance coil. It is therefore difficult to compare the electrical functions of these two types of device.

More specifically, the present invention relates to an electric pulse generator having at least one capacitor connected in the form of a coaxial line section formed by an external conductor and an internal conductor and at least one saturatable inductance coil serving as a switch and positioned between two capacitors, said generator being characterized in that at least one saturatable inductance coil is positioned within the internal conductor of a coaxial line section serving as a capacitor.

According to a first embodiment, the saturatable inductance coil comprises a single toroidal turn. However, it can also be constituted by one or more turns wound around a magnetic core.

The invention is described in greater detail hereinafter relative to non-limitative embodiments and the attached drawings, wherein:

FIG. 1, already described, is the electrical diagram of a pulse compression line.

FIG. 2, already described, shows the voltage shapes at a different points of the preceding line.

FIG. 3, already described, shows a prior art generator.

Figure 4:
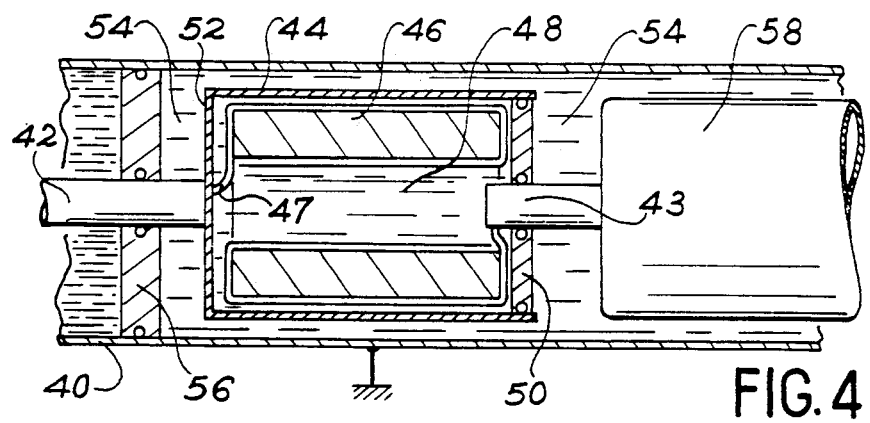
FIG. 4 shows a first embodiment according to the invention.

FIG. 4 shows an external enclosure 40 connected to ground and a central supply conductor 42. The coaxial line section constituting the capacitor is formed by an internal cylindrical conductor 44 and by the facing part of the external enclosure 40. Within the cylinder 44 is located a saturatable inductance coil e.g. constituted by a ferromagnetic toroidal core 46 (ferrite or sheets as a function of the operation frequency) and by a winding 47. The volume within the cylinder is filled with oil 48. Sealing is ensured by an insulating disk 50 and by the bottom 52 of the cylinder 44. Externally, the assembly is immersed in a dielectric liquid 54, e.g. deionized water. Sealing is ensured by an insulating plug 56. The winding 47 connects the bottom 52 to an internal conductor 43.

The electrical output is constituted by a coaxial line formed by an internal conductor 58 connected to conductor 43 and an external conductor constituted by the external enclosure 40. Cylinder 44 and conductor 43 can be made from stainless steel.

In the following drawings, the saturable inductance coil is shown more diagrammatically, without necessarily showing the conductor wound around the core when such a conductor exists.

The magnetic material constituting the toroidal core 46 is preferably a ferromagnetic material with a rectangular cycle, such as e.g. ironsilicon with oriented grains or certain nickel alloys (such as the alloy designated by the trade mark RECTIMPHY) or certain amorphous alloys.

Figure 5:
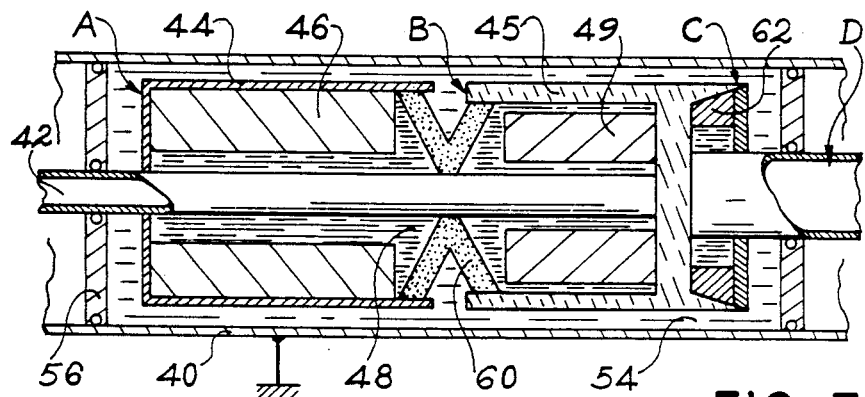
FIG. 5 shows a second embodiment according to the invention.

FIG. 5 shows a variant, in which use is made of a second coaxial line section constituted by an internal conductor 45 and the corresponding part of the external enclosure 40. Within the internal conductor 45 is provided a second magnetic toroidal core 49. A tight part 60 insulates the internal volumes of these two lines. A final saturable inductance coil 62, still located within the internal conductor 45, can complete the assembly.

Figure 6:
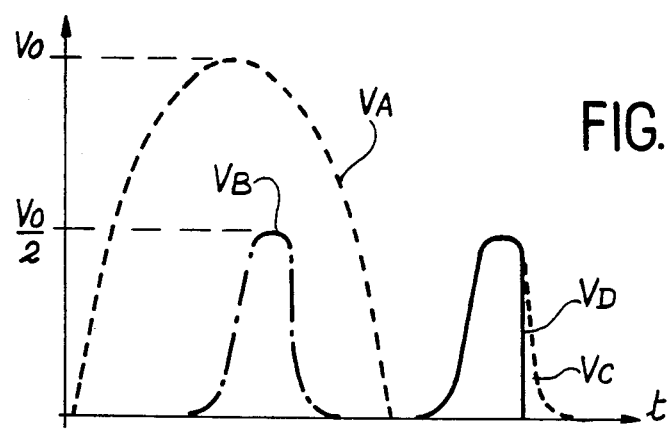
FIG. 6 shows the of voltages taken at different points of the evolution

Points A, B, C and D represent four particular locations of the device. The voltage evolution at these points is represented in FIG. 6, assuming that a sinusoid arch of maximum amplitude Vo is applied to the input (voltage at A). The voltages available at B, C and D have the maximum amplitude Vo/2.

Figure 7:
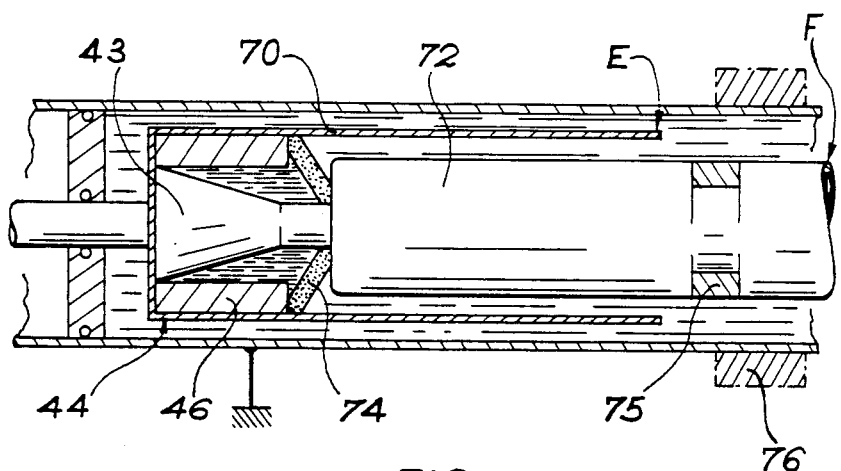
FIG. 7 shows a third device shown in FIG. 5. embodiment of the invention.

In FIG. 7, the device is extended by a so-called BLUMLEIN coaxial line, which has two cylinders 70, 72. The first cylinder is connected to the internal conductor 44 constituting the coaxial line section corresponding to the capacitor and the second to the internal frustum-shaped conductor 43. A frustum-shaped part 74 provides the oil sealing. A saturable inductance coil 75 can be placed at the end of the line to form a leading edge steepening switch, which can also be placed at 76 outside the line.

Figure 8:
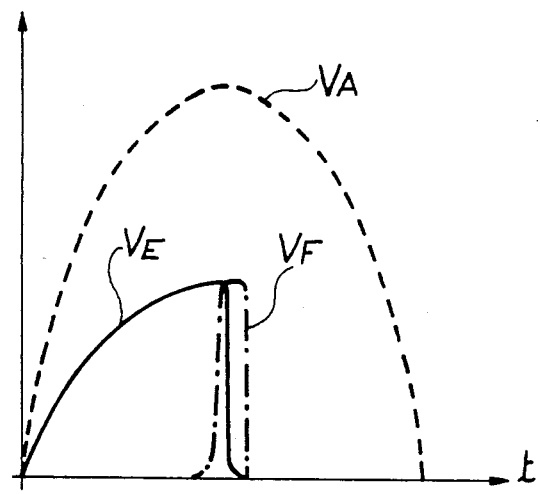
FIG. 8 shows the evolution of the voltages in the device of FIG. 7.

FIG. 8 shows the shapes of the voltages appearing at points E and F, i.e. at the end of the double line and after the final switch.

Figure 1:
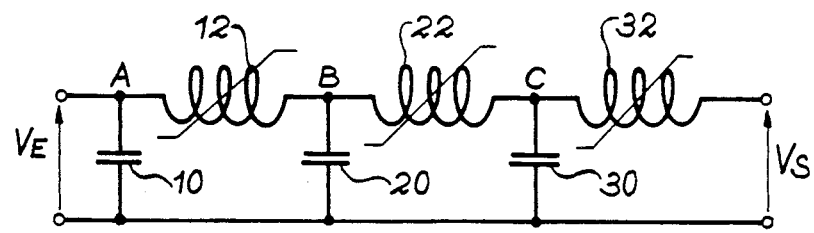
Figure 2:
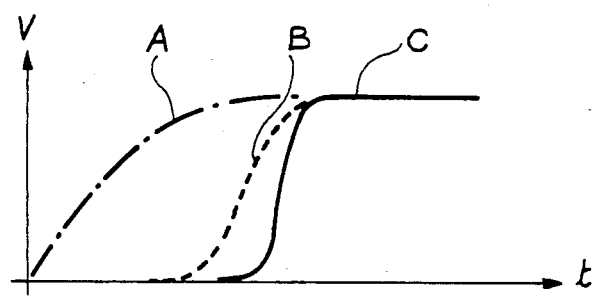
Figure 3:
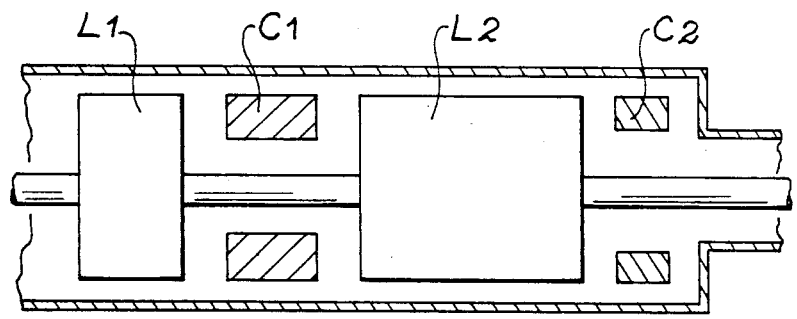
Figure 9:
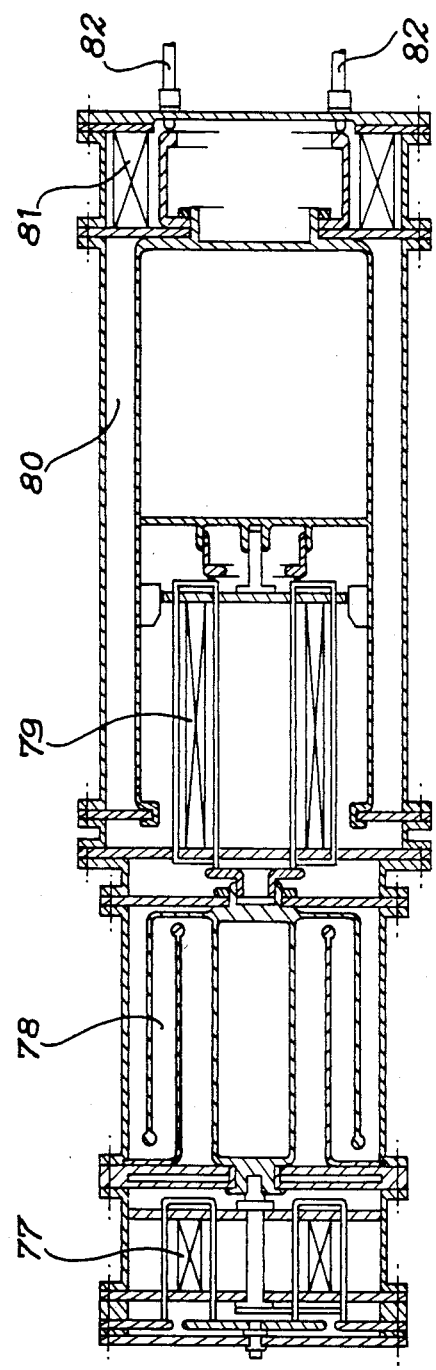
FIG. 9 shows another embodiment according to the invention.

According to an embodiment of the invention illustrated in FIG. 9, a transformer 77 supplies a pulse making it possible to charge a water capacitor 78 constituted by a least two coaxial cylinders. This capacitor is connected to a saturable inductance coil 79 having one or more turns wound around a ferromagnetic core having a hysteresis cycle which is as rectangular as possible. This inductance coil is place within the internal conductor of the line section 80, in such a way that it permits the supply of said line via its center. In this way, the capacity of the coaxial line 80 is connected to capacitor 78 by a saturable inductance coil 79, which constitutes a magnetic compression cell according to the principle of FIG. 1.

Line 80 also constitutes a shaping line making it possible to obtain at the output on a series of coaxial cables 82 connected in parallel to the end of line 80, a narrow rectangular pulse. The cores of cables 82 pass into the core 81, which introduces a saturable series inductance coil, whose operation can be likened to a magnetic switch. Thus, as soon as core 81 is saturated, line 80 discharges into the cables 82, whereof the equivalent impedance is determined in such a way as to be close to that of line 80.

It is thus possible to obtain rectangular pulses of a few hundred kilovolts having durations of several dozen nanoseconds.

We claim:

1. An electric pulse generator comprising:
   a first capacitor formed by a first coaxial line section with a first external conductor and a first internal conductor arranged within said first external conductor, and
   a first inductance coil which is saturatable and serves as a switch, said first inductance coil being arranged within said first internal conductor.

2. The generator according to claim 1, wherein said first inductance coil comprises a single toroidal turn.

3. The generator according to claim 1, further comprising a second coaxial line section with a second internal conductor arranged within said first external conductor, and a second inductance coil arranged within said second internal conductor, said first and second internal conductors being connected to a common central conductor.

4. The generator according to claim 1, further comprising a double transmission line formed by a first cylindrical conductor connected to said first internal conductor and a second cylindrical conductor coaxial with said first cylindrical conductor and connected by an internal conductor to said first coaxial line section.

5. The generator according to claim 1, wherein said first coaxial line section has an internal volume filled with oil and said first coaxial line section overall is immersed in an insulating fluid, further comprising tight electrically insulating means arranged to insulate the interior and exterior of said first internal conductor.

6. The generator according to claim 1, further comprising a second capacitor electrically coupled to said first capacitor by said first inductance coil.

* * * * *